United States Patent
Johnson

(12) 
(10) Patent No.: US 6,201,385 B1
(45) Date of Patent: Mar. 13, 2001

(54) VOLTAGE AND CONTINUITY TESTER

(76) Inventor: David R. Johnson, 13792 Bewley St., Garden Grove, CA (US) 92843

( * ) Notice: Subject to any disclaimer, the term of this patent is extended or adjusted under 35 U.S.C. 154(b) by 0 days.

(21) Appl. No.: 09/309,965

(22) Filed: May 11, 1999

(51) Int. Cl.[7] .................... G01R 31/02; G01R 19/145
(52) U.S. Cl. ..................... 324/133; 324/66; 324/542; 324/555
(58) Field of Search .................. 324/133, 66, 67, 324/537, 542, 543, 555; 340/652, 384.6

(56) References Cited

U.S. PATENT DOCUMENTS

| | | | |
|---|---|---|---|
| 3,768,005 | * | 10/1973 | Louks ................................ 324/133 |
| 4,225,817 | * | 9/1980 | Kahlden ............................ 324/133 |
| 4,356,442 | * | 10/1982 | Beha ................................. 324/133 |
| 4,366,434 | * | 12/1982 | Ellis .................................. 324/133 |
| 4,527,118 | * | 7/1985 | Koslar ............................... 324/133 |
| 4,652,813 | * | 3/1987 | Bakke et al. ....................... 324/66 |
| 4,797,623 | * | 1/1989 | Hoffman et al. .................. 324/556 |
| 5,003,249 | * | 3/1991 | Bird .................................. 324/133 |
| 5,481,185 | * | 1/1996 | Lane et al. ........................ 324/145 |
| 5,672,964 | * | 9/1997 | Vinci ................................ 324/72.5 |

* cited by examiner

Primary Examiner—Glenn W. Brown

(57) ABSTRACT

A voltage and continuity tester consists of a positive probe, a negative probe, and a valve finder probe. An AC/DC activated loud buzzer is coupled across the positive probe and the negative probe. In the preferred embodiment, the valve finder probe is coupled to the negative probe via a diode. In operation, the voltage and continuity tester is a simple, convenient and affordable diagnostic tool used to systematically troubleshoot common problems with irrigation and other systems. The loud AC/DC activated buzzer allows diagnosis of system failures from a remote location and eliminates the need to stay within close visual range for interpretation of test results. When used to test irrigation systems, the valve finder probe allows a user to quickly and easily locate any valve in the system. In the preferred embodiment, the positive probe and the negative probe include piercing connectors that break through the insulation of a wire and directly contact the wire without having to cut the insulation.

17 Claims, 4 Drawing Sheets

VOLTAGE AND CONTINUITY TESTER

BACKGROUND OF THE INVENTION

The present invention relates to voltage and continuity testers. More specifically, the invention relates to an improved, portable, easy to use voltage and continuity tester for troubleshooting common problems with electrical systems. The present invention is generally directed towards the field of irrigation systems, but it can also be used to diagnose electrical problems in automotive systems, industrial equipment, low voltage lighting and the like.

Voltage and continuity testers are well known diagnostic tools in many industries. In the field of irrigation systems, voltage and continuity testers are used to check for broken or shorted wires in the system, check for an open solenoid, check the power output at the system's controller, identify unknown wiring and test for proper activation of the system's valves. Existing diagnostic tools, such as general purpose multi-meters, are complicated, bulky and expensive. These diagnostic tools often employ LEDs that are hard to see or meters that require interpretation. They also require the user to stay in close visual range for interpretation of the results. This can be quite time consuming and inconvenient, especially when testing an irrigation system with multiple sprinkler stations distributed over an area of property. Often times, this means that two people must be involved in the testing—one person to operate the system's controller and a second person to test each sprinkler station with the diagnostic tool. Although existing diagnostic tools can accomplish most of testing that is needed for an irrigation system, none offer a quick and easy way to locate one or all of the system's valves, which is an essential procedure when working with sprinklers.

In addition, most diagnostic tools require that the wires be cut in order to be tested. After the testing is complete, the wires are then spliced back together. This is time consuming and also reduces the reliability of the system. Furthermore, with many voltage and continuity testers, the user must appropriately set a switch to select an AC or DC mode of operation.

Accordingly, there is a need for an improved voltage and continuity tester that is portable, easy to use and affordable. There is also a need for a voltage and continuity tester that does not require interpretation of results and can be operated by a single user. Moreover, there is a need for a voltage and continuity tester that allows a user to quickly and easily locate one or all of the valves in an irrigation system.

BRIEF SUMMARY OF THE INVENTION

A voltage and continuity tester includes a positive probe, a negative probe and a valve finder probe. An AC/DC activated buzzer is coupled across the positive probe and the negative probe. Preferably, the buzzer is a loud piezoelectric device that emits a 95 dB tone that can be heard at long distances. The valve finder probe is coupled to the negative probe via a diode. In the preferred embodiment, the positive probe and the negative probe include piercing connectors that break through the insulation of a wire and directly contact the wire without having to cut the insulation.

The voltage and continuity tester of the present invention is portable, light weight, affordable and easy to use. The loud tone from the buzzer audibly indicates test results and eliminates the need to interpret meter readings or observe hard to see LEDs. The buzzer also eliminates the need for the user to be in close visual range of the tester, thus making it a "one-man" operation. The built in valve finder probe allows the user to quickly and easily locate one or any of the valves in an irrigation system. The piercing connectors on the probes making cutting and splicing of wires unnecessary, thus saving time and preserving the system's reliability. The voltage and continuity tester is operable over a 6 to 24 volt range and is AC or DC compatible, making it useful for a variety of different applications.

BRIEF DESCRIPTION OF THE DRAWINGS

In the drawings, wherein similar reference characters denote similar elements throughout the several views.

DETAILED DESCRIPTION

Figure 1:
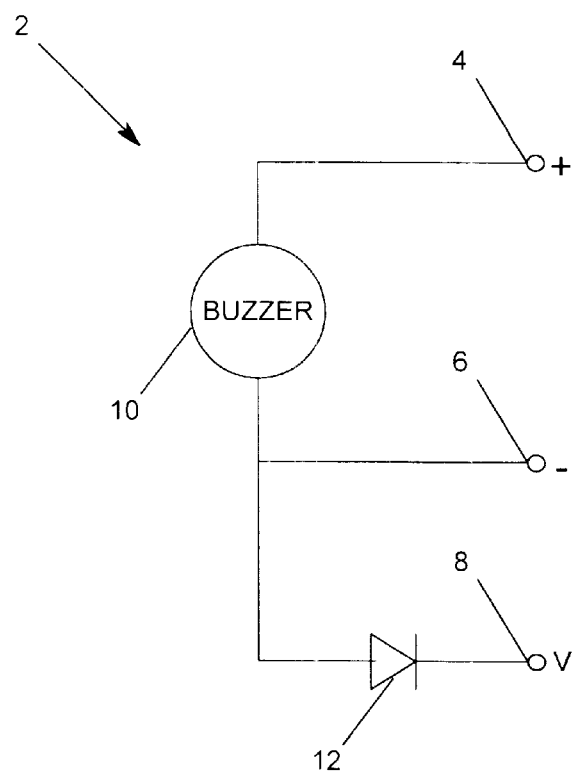
FIG. 1 is a block diagram representing the preferred embodiment of the voltage and continuity tester of the present invention.

Referring now to the drawings and initially to FIG. 1, the preferred embodiment of the device 2 consists of a positive probe 4, a negative probe 6, and a valve finder probe 8. An AC/DC activated loud buzzer 10 is coupled across the positive probe 4 and the negative probe 6. In the preferred embodiment, the buzzer 10 is a loud piezoelectric device, such as Model No. 754240 from DB Products Ltd., which emits a 95 dB tone that can be heard at long distances. The valve finder probe 8 is coupled to the negative probe 6 via a diode 12. In the preferred embodiment, the device 2 has an operating range from 6 to 24 volts and is AC or DC compatible.

In its first mode of operation, the device 2 is used as a simple, convenient tester that allows the user to troubleshoot common problems with irrigation systems, such as lawn sprinkler systems. In general, lawn sprinkler systems consist of a main controller that controls a number of valves in order to turn on and turn off sprinklers in various zones at specific times of the day. The valves for each individual sprinkler station are operated by solenoids. The main controller is connected to each solenoid by an individual power wire that supplies power to the solenoid which, in turn, operates the valve for each individual sprinkler station and also by a common wire that is connected to all of the solenoids in the system. For the purposes of this discussion, the terminal where the power wire is connected to the controller will be called the station terminal and the terminal where the common wire is connected to the controller will be called the common terminal. In this manner, the device 2 can be used to check for power output at the system's controller, test for broken or shorted wires or an open solenoid, test for proper activation of one of the system's valves, determine which of the two wires going to a valve are broken, as well as identification of which wires go to which valve in an unmarked system.

In the procedures discussed below, the connections are described for a positive polarity, DC system unless otherwise noted. If polarity is negative, the location of the positive probe 4 and the negative probe 6 should be reversed. In an AC system, such as most irrigation systems, the probe polarity does not matter.

Figure 2:
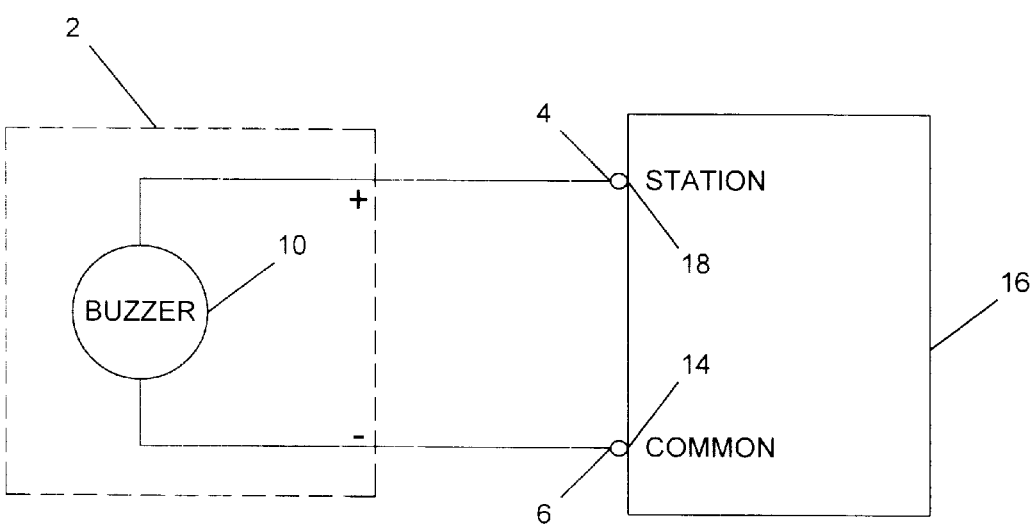
FIG. 2 is a block diagram representing the voltage and continuity tester of the present invention in use to test the power output of a system's controller.

In order to check the power output at the system's controller 16, the device 2 is connected as shown in FIG. 2. In this case, a user would simply connect the negative probe 6 to the common terminal 14 of the controller 16 and connect the positive probe 4 to the station terminal 18 for the particular station under test. When the user activates the station under test by operating the controller 16, a properly operating controller 16 will produce a voltage at the station terminal 18. This voltage will activate the buzzer 10, indicating a properly operating system controller 16 for that particular station.

Figure 3:
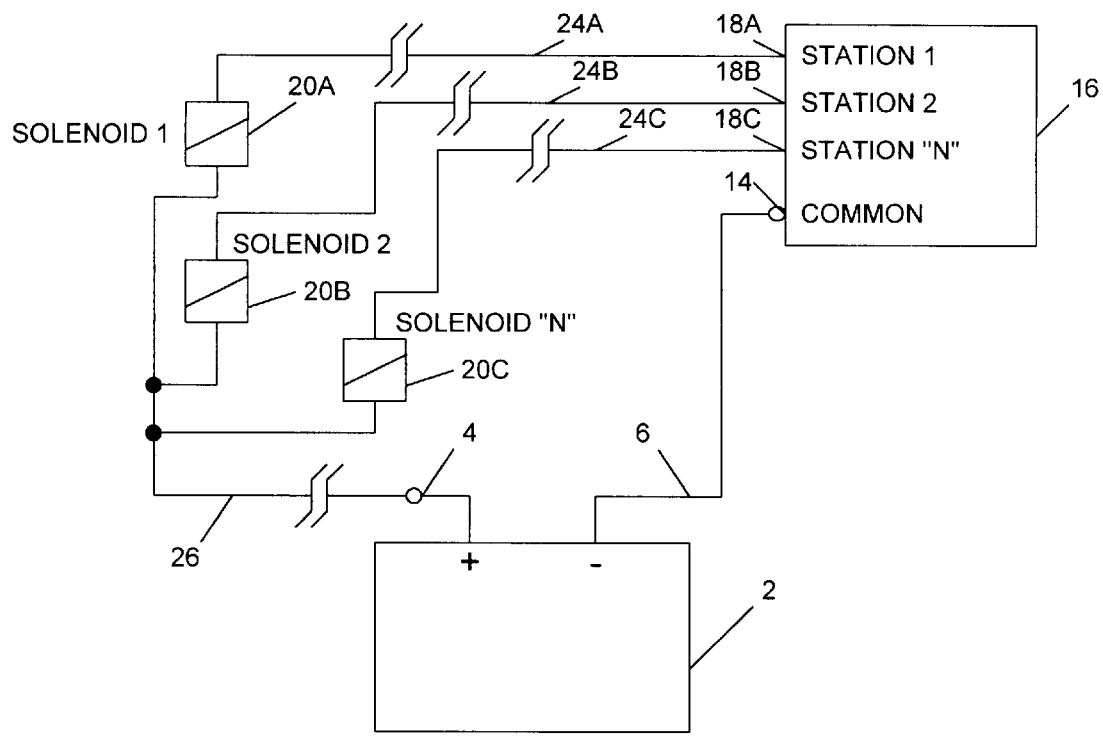
FIG. 3 is a block diagram representing the voltage and continuity tester of the present invention in use to check for a broken wire in a system.

In order to check for a broken wire in the system, the device 2 is connected as shown in FIG. 3. The common wire 26 is disconnected from the common terminal 14 at the controller 16. The negative probe 6 of the device 2 is then connected to the common terminal 14 and the positive probe 4 is connected to the common wire 26 which is connected in series to each solenoid (20A, 20B, 20C) in the system. The power wires (24A, 24B, 24C) connect the solenoids (20A, 20B, 20C) to their respective station terminals (18A, 18B, 18C) at the controller 16. Then, one by one, each station is activated at the controller 16. As each station is activated, if the wiring is intact, current flowing through the solenoid and back to the controller 16 activates the buzzer 10. If the buzzer 10 makes no sound for just one of the stations, then the power wire for that station is faulty, there is a bad connection where the power wire is connected to the solenoid, or the solenoid is open. If none of the stations activate the buzzer 10, then the common wire 26 is open circuit.

Figure 4:
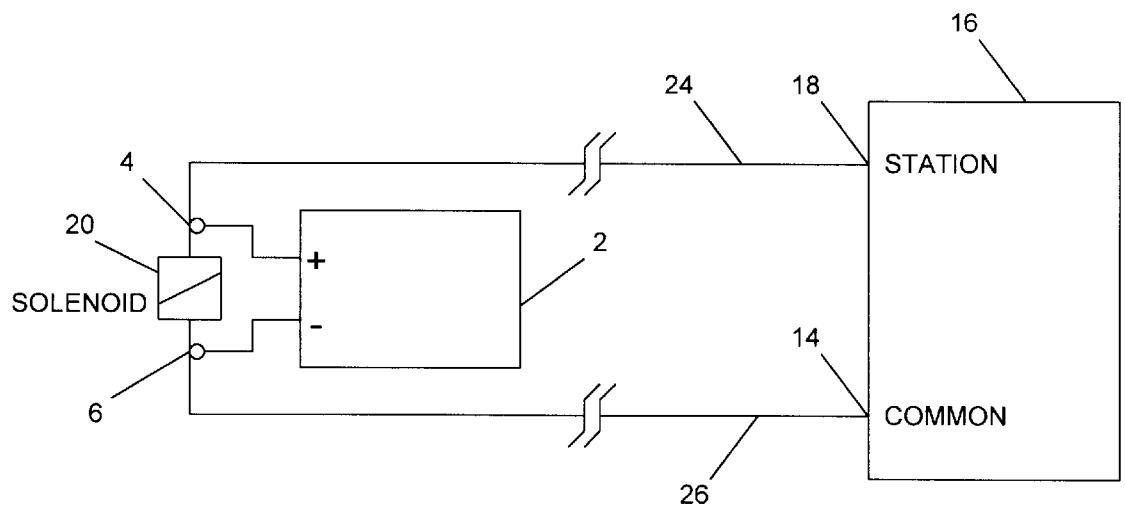
FIG. 4 is a block diagram representing the voltage and continuity tester of the present invention in use to test that power is being properly applied to a solenoid-controlled valve.

The power can also be checked at the valve itself as shown in FIG. 4. The positive probe 4 and the negative probe 6 are placed across the solenoid 20 itself, and the station is activated at the controller 16. A tone from the buzzer 10 indicates that power is being properly applied to the solenoid 20. No tone indicates that one of the wires going to the solenoid 20 is faulty.

Figure 5:
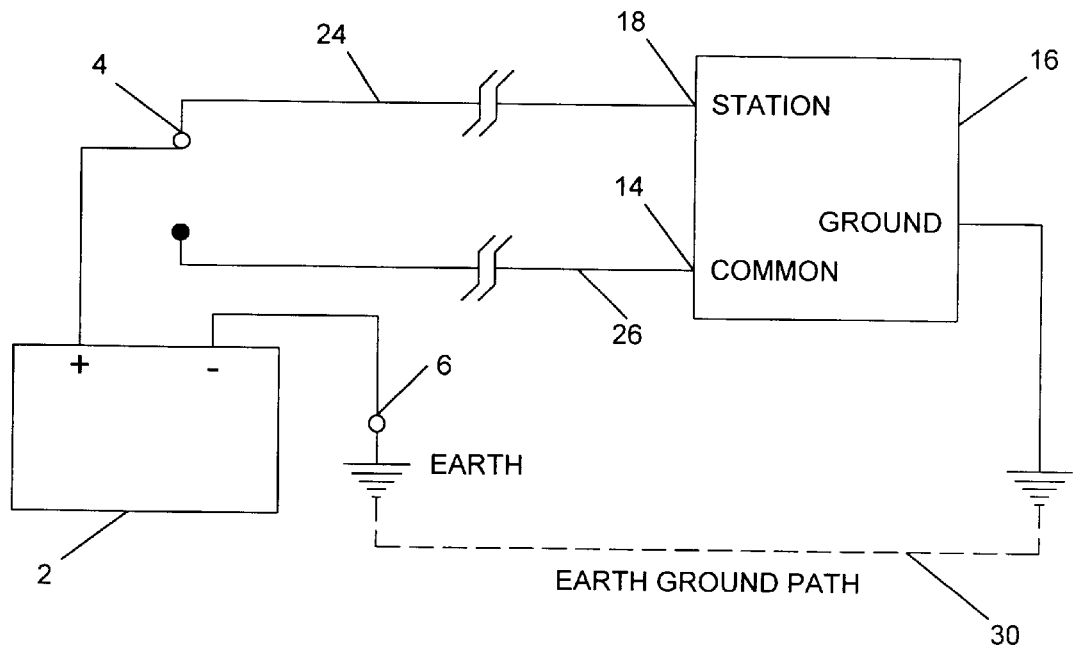
FIG. 5 is a block diagram representing the voltage and continuity tester of the present invention in use to identify faulty wires in a system.

If the test described by FIG. 4 indicates that one of the wires is faulty, the wire can be identified by the test shown in FIG. 5. First, the wire connections to the solenoid 20 (as shown in FIG. 4) are removed, and the station is activated at the controller 16. Then, the positive probe 4 is connected to the power wire 24 for the solenoid, and the negative probe 6 is connected to earth via some kind of metal conductor such as a screwdriver. Assuming the controller 16 is properly grounded, the earth ground 30 provides a return path for the power wire 24, and, as long as the power wire 24 is intact the buzzer 10 will be activated (although likely it will not produce a full volume signal due to the higher resistance of the earth ground path). If the buzzer 10 is activated, then the faulty wire must be the common wire 26. If the buzzer 10 is not activated then, of course, the power wire 24 is faulty.

Figure 6:
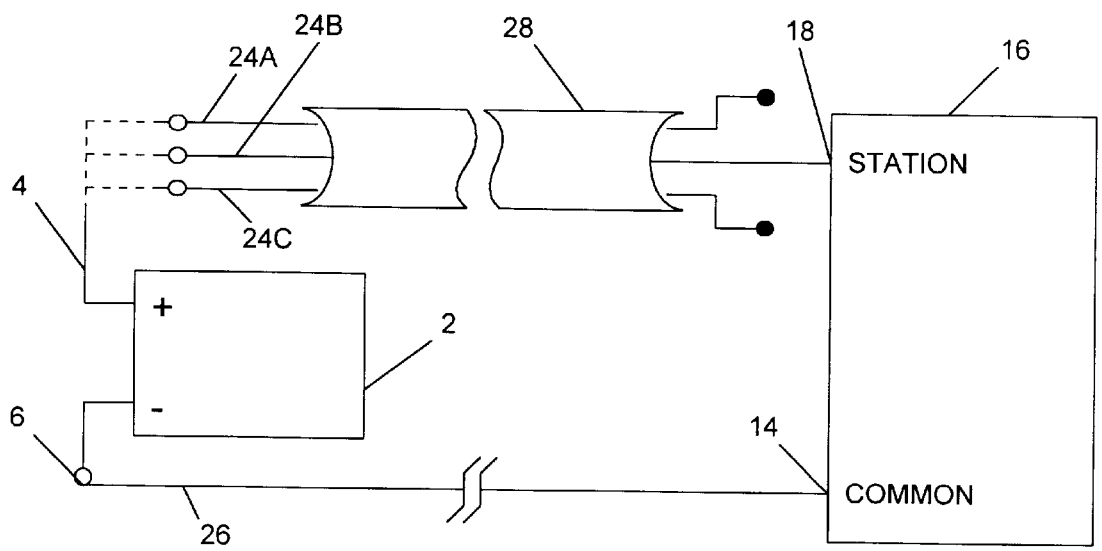
FIG. 6 is a block diagram representing the voltage and continuity tester of the present invention in use to identify incorrectly color coded wiring.

As shown in FIG. 6, the device 2 can be used to identify incorrectly color coded wiring. The power wires (24A, 24B, 24C) are contained within a multi-wire cable 28. The station to be identified is activated at the controller 16, and the negative probe 6 is connected to the common wire 26. The positive probe 4 is connected to each power wire (24A, 24B, 24C) in turn, until the buzzer 10 sounds. Then, this wire can be marked corresponding to the correct station number.

Figure 7:
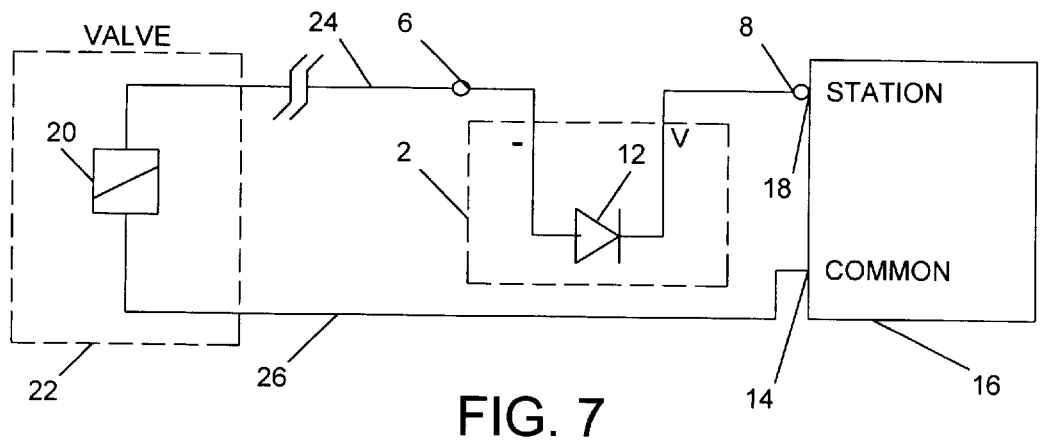
FIG. 7 is a block diagram representing the voltage and continuity tester of the present invention in use to locate a valve in an AC system.

FIG. 7 shows how the valve finder probe 8 can be used to locate a valve 22 in an AC system. The valve finder probe 8 and the negative probe 6 are connected in series with one of the station power wires 24, and the water flow is shut off to allow the valve 22 to operate freely. When the station is activated at the controller 16, the diode 12 will interrupt current flow to the solenoid 20 for one half of each cycle of the AC signal. This will cause the solenoid 20 of the valve 22 connected to this station to click loudly, thus identifying it to the user.

Figure 8:
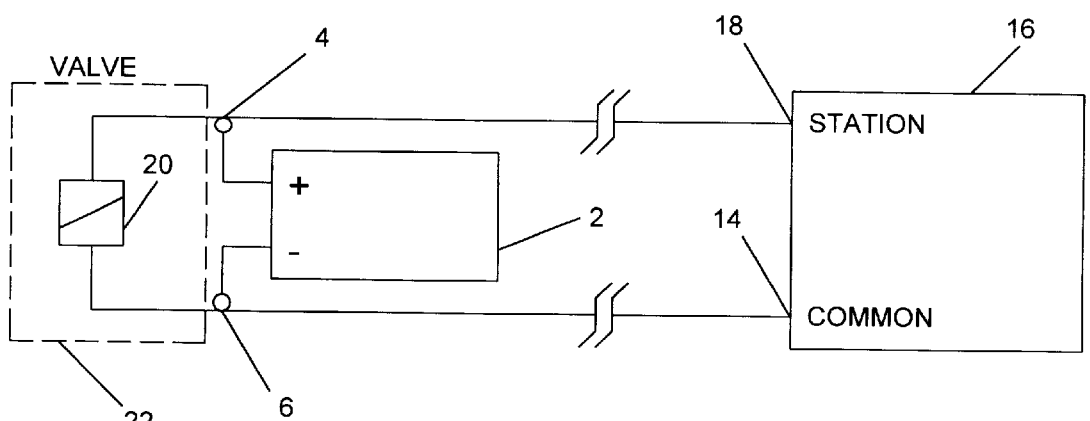
FIG. 8 is a block diagram representing the voltage and continuity tester of the present invention in use to map out a valve connection.

Referring now to FIG. 8, the device 2 can be used to map out which valve is connected to which station. The positive probe 4 and the negative probe 6 are connected across the valve 22 to be mapped. The user then returns to the controller 16 and activates each station, one at a time, until the loud tone is heard. As the controller 16 is often located at some distance from the valve 22, the 95 decibel level of the buzzer 10 allows the user to identify the valve 22 without having to walk out to the valve 22 as each station is activated.

Figure 9:
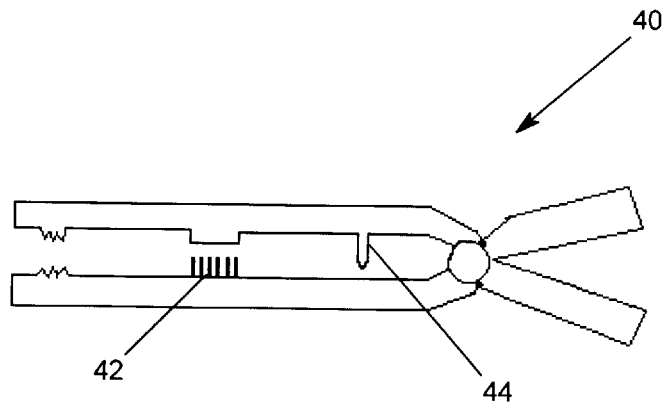
FIG. 9 is a side view of the probe used in the preferred embodiment of the present invention.

FIG. 9 shows a drawing of the probe 40 used in the preferred embodiment. In general function, the probe is similar to a normal "alligator clip". However, the probe 40 of the present invention offers an additional benefit of two types of piercing connectors: a "bed of needles" 42 which causes minimum damage to the insulation, and a single, larger needle 44 for larger gauge wire. In order to trace down a faulty wiring connection, one must often apply a "divide and conquer" approach; cutting the wire at its midpoint, testing the system to determine which side is bad, splicing the wire, then moving to the midpoint of the faulty segment and repeating the test. Needless to say, this leads to a lot of cutting and splicing, which, in addition to taking a lot of time, reduces the reliability of the system in and of itself.

The piercing connectors (42, 44) allow the above-mentioned tests to be performed without cutting and splicing. The piercing connectors (42, 44) break through the insulation and directly contact the wire beneath. After the tests are completed, the insulation can be quickly and easily repaired with electrical potting compound.

In addition to its application in irrigation systems, the device 2 can be used in other situations where a visible continuity tester is not practical. For example, in many automotive wiring applications, such as testing starter motors, power windows, trunk releases, etc., a momentary signal is applied to a device, and the device and the source of activation are not located in proximity to one another. The loud buzzer 10 of this invention allows the user to effectively test these kinds of devices, as the loud tone provides a clear audible indication of continuity. The device 2 can also be used to test low voltage lighting, fuses and relays, transformers, commercial equipment and the like. It should be noted that for non-irrigation specific applications, the valve finder probe 8 and the diode 12 are not needed.

Thus a novel voltage and continuity tester has been shown and described. Various modifications and substitutions of equivalents may of course be made without departing from the spirit and scope of the invention. The invention, therefore, should not be limited, except to the following claims and their equivalents.

What is claimed is:

1. A voltage and continuity tester comprising:
   a first probe for connecting to a first wire in an electrical system;
   a second probe for connecting to a second wire in the electrical system; and
   a voltage activated buzzer coupled across the first probe and the second probe; wherein
   at least one of the first probe and the second probe includes a piercing connector that pierces its wire's insulation and directly contacts the wire beneath; and wherein
   the piercing connector is an arrangement of small needles.

2. The voltage and continuity tester of claim 1 wherein the voltage activated buzzer is a piezoelectric device that emits a high decibel tone that can be heard at long distances.

3. The voltage and continuity tester of claim 2 wherein the voltage activated buzzer is an AC/DC activated buzzer.

4. The voltage and continuity tester of claim 1 wherein the first probe is a positive probe and the second probe is a negative probe.

5. The voltage and continuity tester of claim 1 wherein the piercing connector also includes a single needle capable of piercing a large gauge wire.

6. The voltage and continuity tester of claim 1 further comprising:
   a valve finder probe for locating a valve in an irrigation system; and
   a diode, wherein the valve finder probe is coupled to one of the first probe and the second probe through the diode.

7. The voltage and continuity tester of claim 1, wherein the tester is AC or DC compatible.

8. A method of locally testing wire continuity to a remote device comprising the steps of:
   connecting a first probe to a first terminal of the device;
   connecting a second probe to a second terminal of the device;
   coupling a loud buzzer across the first probe and the second probe;
   activating a local power source;
   listening for a tone from the buzzer to indicate continuity to the remote device; and
   identifying which of a plurality of unidentified wires is electrically continuous to the device.

9. The method of claim 8 whereby the step of identifying which of a plurality of unidentified wires is electrically continuous to the device includes activating the power source to each of the unidentified wires.

10. A voltage and continuity tester comprising:
    a first probe for connecting to a first wire in an electrical system;
    a second probe for connecting to a second wire in the electrical system;
    a voltage activated buzzer coupled across the first probe and the second probe;
    a valve finder probe for locating a valve in an irrigation system; and
    a diode, wherein the valve finder probe is coupled to one of the first probe and the second probe through the diode.

11. The voltage and continuity tester of claim 10, wherein the voltage activated buzzer is a piezoelectric device that emits a high decibel tone that can be heard at a long distance.

12. The voltage and continuity tester of claim 11, wherein the voltage activated buzzer is an AC/DC activated buzzer.

13. The voltage and continuity tester of claim 10, wherein the first probe is a positive probe and the second probe is a negative probe.

14. The voltage and continuity tester of claim 10, wherein at least one of the first probe and the second probe includes a piercing connector that pierces its wire's insulation and directly contacts the wire beneath.

15. The voltage and continuity tester of claim 14, wherein the piercing connector is an arrangement of small needles.

16. The voltage and continuity tester of claim 14, wherein the piercing connector is a single needle capable of piercing a large gauge wire.

17. The voltage and continuity tester of claim 10, wherein the tester is AC or DC compatible.

* * * * *